(12) United States Patent
Park et al.

(10) Patent No.: US 8,418,356 B2
(45) Date of Patent: Apr. 16, 2013

(54) METHOD OF MANUFACTURING AN EMBEDDED PRINTED CIRCUIT BOARD

(75) Inventors: Kwang Soo Park, Busan (KR); Myung Gun Chong, Gyeongsangnam-do (KR); Dek Gin Yang, Chungcheongbuk-do (KR); Dae Jung Byun, Busan (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 964 days.

(21) Appl. No.: 12/213,704

(22) Filed: Jun. 23, 2008

(65) Prior Publication Data

US 2009/0242251 A1 Oct. 1, 2009

(30) Foreign Application Priority Data

Mar. 25, 2008 (KR) .................. 10-2008-0027371

(51) Int. Cl.
*H01L 21/58* (2006.01)
*H05K 1/18* (2006.01)
*H05K 3/32* (2006.01)
*H05K 3/46* (2006.01)

(52) U.S. Cl.
USPC ............... 29/832; 29/847; 174/260; 361/761

(58) Field of Classification Search ............ 29/832, 29/837, 846, 847; 174/260; 361/761; 257/725, 257/723; 438/118, 125, 106
See application file for complete search history.

(56) References Cited

U.S. PATENT DOCUMENTS

| 6,309,912 B1* | 10/2001 | Chiou et al. | 438/118 |
| 2004/0001324 A1* | 1/2004 | Ho et al. | 361/761 |
| 2006/0291173 A1* | 12/2006 | Cho et al. | 361/760 |

FOREIGN PATENT DOCUMENTS

| CN | 1577813 A | 2/2005 |
| JP | 2002-237683 | 8/2002 |
| KR | 10-0762758 | 9/2007 |
| KR | 10-0796523 | 1/2008 |
| KR | 10-0827315 | 3/2008 |

OTHER PUBLICATIONS

Office Action issued by the Korea Patent Office on Dec. 14, 2009 in the corresponding Korean patent application No. 10-2008-0027371.
Notice of Allowance issued by the Korea Patent Office on Jun. 18, 2010 in the corresponding Korean patent application No. 10-2008-0027371.

* cited by examiner

*Primary Examiner* — Livius R Cazan

(57) ABSTRACT

The present invention relates to an embedded printed circuit board and a manufacturing method thereof. The present invention provides an embedded printed circuit board including a substrate in which a cavity is formed in a predetermined portion and a wiring layer is formed in a portion without the cavity; a chip inserted into the cavity and including a plurality of pads; a filler filled between the chip and the cavity to fix the chip; and a connection layer formed between the wiring layer and the pads to connect the wiring layer and the pads to each other. Further, the present invention provides a manufacturing method of the embedded printed circuit board.

7 Claims, 5 Drawing Sheets

METHOD OF MANUFACTURING AN EMBEDDED PRINTED CIRCUIT BOARD

CROSS-REFERENCE TO RELATED APPLICATIONS

This application claims the benefit of Korean Patent Application No. 10-2008-0027371 filed with the Korea Intellectual Property Office on Mar. 25, 2008, the disclosure of which is incorporated herein by reference.

BACKGROUND OF THE INVENTION

1. Field of the Invention

The present invention relates to an embedded printed circuit board and a manufacturing method thereof; and more particularly, to an embedded printed circuit board to directly connect a wiring layer and a pad to each other by forming a connection layer between the wiring layer and the pad, and a manufacturing method thereof.

2. Description of the Related Art

Recently, in accordance with the demands for high-performance and miniaturization of electronic apparatuses, electronic components have shown high density and high performance characteristics. Accordingly, a demand for a downsized printed circuit board on which the electronic components can be mounted with high density has been gradually increased. In accordance with such demand, a multi-layered circuit board to electrically connect wires formed on different layers or the electronic components and the wires to each other by a via hole has been developed.

The multi-layered circuit board has advantages to shorten the wire for connecting the electronic components to each other as well as realize high-density wiring. Further, the multi-layered circuit board extends a surface area of the printed circuit board by mounting the electronic components and has an excellent electrical characteristic.

In particular, in an embedded printed circuit board into which the electronic components are inserted since the electronic components are not mounted on a surface of the board, but are embedded in the inside of the board, a miniaturization, high-density, and high-performance or the like of the board can be realized, whereby a demand for the embedded printed circuit board has been gradually increased.

SUMMARY OF THE INVENTION

An advantage of the present invention is that it provides an embedded printed circuit board in which a connection layer is formed between a wiring layer and a pad to electrically connect the wiring layer and the pad directly to each other, thereby reducing the number of layers of the board, and a manufacturing method thereof.

In order to achieve the above-mentioned advantage, in accordance with an aspect of the invention, an embedded printed circuit board includes a substrate in which a cavity is formed in a predetermined portion and a wiring layer is formed in a portion without the cavity; a chip inserted into the cavity and including a plurality of pads; a filler filled between the chip and the cavity to fix the chip; and a connection layer formed between the wiring layer and the pads to connect the wiring layer and the pads to each other.

Herein, the connection layer may be connected to a pad positioned in an outermost portion of the chip.

The connection layer horizontally may connect the wiring layer and the pads to each other on the filler.

The connection layer may be made of copper (Cu) or silver (Ag).

The connection layer may be formed on one surface or both surfaces of the substrate.

The chip may be any one selected from a group consisting of an active element, a passive element, and an IC (Integrated Circuit).

In order to achieve the above-mentioned advantage, in accordance with an aspect of the invention, a method of manufacturing an embedded printed circuit board includes the steps of: (a) forming a cavity in a predetermined portion of a substrate with a wiring layer; (b) attaching an adhesive sheet on one surface of the substrate; (c) inserting a chip with a plurality of pads into the cavity to fix the inserted chip onto the adhesive sheet; (d) filling a filler between the cavity and the chip; and (e) forming a connection layer connected to the wiring layer and the pads between the wiring layer and the pads.

Herein, the connection layer may be connected to a pad positioned in an outermost portion of the chip.

The connection layer horizontally may connect the wiring layer and the pads to each other on the filler.

The connection layer may be made of copper (Cu) or silver (Ag).

The chip may be any one selected from a group consisting of an active element, a passive element, and an IC (Integrated Circuit).

In order to achieve the above-mentioned advantage, in accordance with another aspect of the invention, a method of manufacturing an embedded printed circuit board includes the steps of: (a) forming a cavity in a predetermined portion of a substrate with a wiring layer; (b) attaching an adhesive sheet on one surface of the substrate; (c) inserting a chip with a plurality of pads into the cavity to fix the inserted chip onto the adhesive sheet; (d) filling a filler between the cavity and the chip; (e) forming a connection layer connected to the wiring layer and the pads between the wiring layer and the pads; (f) removing the adhesive sheet; (g) additionally forming the wiring layer and the pads on the substrate exposed by removing the adhesive sheet and the chip, respectively; and (h) forming a second connection layer connected to the additionally formed wiring layer and the pads between the additionally formed wiring layer and the pads.

Herein, the second connection layer may be connected to a pad positioned in an outermost portion of the chip.

The second connection layer horizontally may connect the wiring layer and the pads to each other on the filler.

The second connection layer may be made of copper (Cu) or silver (Ag).

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
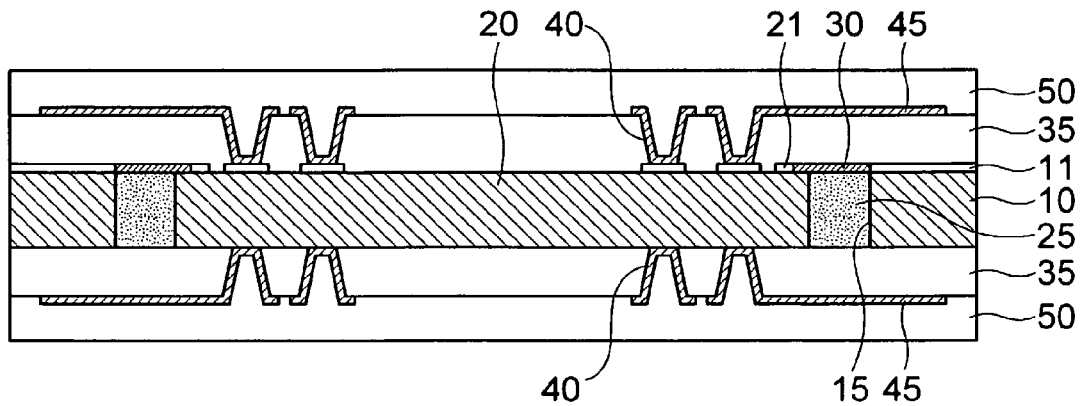
FIG. 1 is a cross-sectional view showing a structure of an embedded printed circuit board in accordance with an embodiment of the present invention.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Embodiment of Structure of Embedded Printed Circuit Board

First, referring to FIG. 1, an embedded printed circuit board in accordance with an embodiment of the present invention will be described in detail.

FIG. 1 is a cross-sectional view showing a structure of the printed circuit board in accordance with the embodiment of the present invention.

As shown in FIG. 1, the embedded printed circuit board in accordance with the embodiment of the present invention includes a substrate 10 having a cavity 15 formed in a predetermined portion, a chip 20 which is inserted into the cavity 15 and has a plurality of pads 21, and a filler 25 which is filled between the chip 20 and the cavity 15 to fix the chip 20.

The substrate 10 may be formed of a reinforcement base material such as an epoxy resin or glass.

A wiring layer 11 is formed in a portion in which the cavity 15 is not formed on the substrate 10. The wiring layer 11 may be formed on the substrate 10 by stacking a copper foil, or the like.

A method of forming the cavity 15 of the substrate 10 can be one of various methods such as pressing, drilling, laser processing, and the like. Among them, it is preferable that a desmear process of removing a smear generated at the time of forming the cavity 15 by the pressing or drilling method is additionally performed.

The chip 20 may be an active element, a passive element, or an IC (Integrated Circuit).

The filler 25 may be generally made of a resin, epoxy, a prepreg, or the like. In particular, in the embodiment of the present invention, a connection layer 30 for connecting the wiring layer 11 and the pad 21 is formed between the wiring layer 11 of the substrate 10 and the pads 21 of the chip 20. The connection layer 30 may be made of copper (Cu), silver (Ag), or the like.

As shown in the figure, the connection layer 30 is connected to the pads 21 positioned in an outermost portion of the chip 20 to directly connect the outermost pad 21 and the wiring layer 11 to each other.

At this time, it is preferable that the connection layer 30 is formed to horizontally connect the wiring layer 11 and the pad 21 to each other on the filler 25.

First and second insulation layers 35 and 50 provided with via holes 40 for the fan-out of rest of pads 21 other than the outermost pad 21 and the connection of interlayer wires 40 and conductors 45 are sequentially stacked on the substrate 10 including the connection layer 30 formed thereon.

The embedded printed circuit board in accordance with the embodiment of the present invention has a structure in which the connection layer 30 is formed between the wiring layer 11 of the substrate 10 and the pads 21 of the chip 20 and the outermost pad 21 of the chip 20 is fanned out on the same layer. A layer including the via holes for the fan-out of the outermost pad 21 needs not to be further formed.

Accordingly, in accordance with the embodiment of the present invention, since an insulation layer forming process, a via hole forming process, and a conductor forming process of one layer for the fan-out of the outermost pad 21 can be omitted, the board can be thinned by decreasing the total number of layers on the board. Therefore, it is possible to reduce the number of processes and manufacturing cost.

Figure 2:
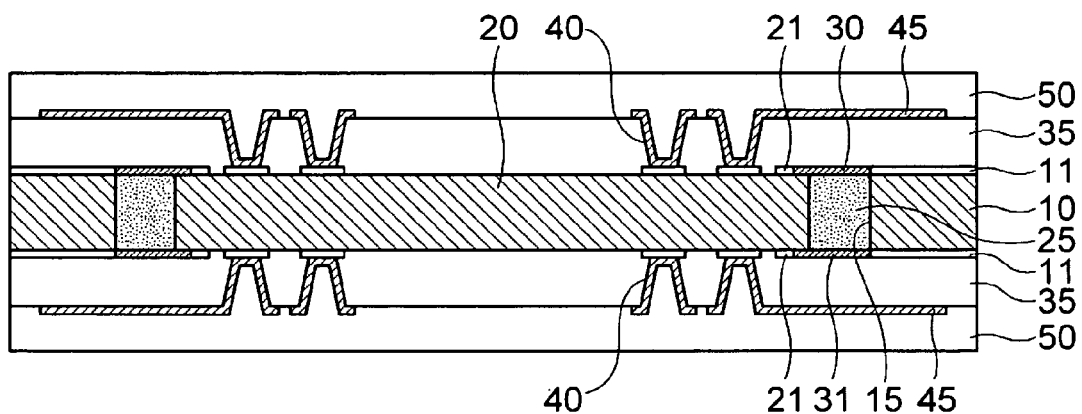
FIG. 2 is a cross-sectional view showing a structure of an embedded printed circuit board in accordance with another embodiment of the present invention.

Herein, as shown in FIG. 1, the connection layer 30 connecting the wiring layer 11 and the pads 21 to each other may be formed on one surface of the substrate 10 or as shown in FIG. 2, the connection layer 30 may be formed on both surfaces of the substrate 10.

FIG. 2 is a cross-sectional view showing a structure of an embedded printed circuit board in accordance with another embodiment of the present invention.

As shown in FIG. 2, the embedded printed circuit board in accordance with another embodiment of the present invention has a similar configuration as the embedded printed circuit board in most configurations. However, the embedded printed circuit board in accordance with another embodiment of the present invention is different from the embedded printed circuit board in that the wiring layer 11 and the pads 21 are not formed on only one surface of each of the substrate 10 and the chip 20, but the wiring layer 11 and the pads 21 are formed on both surfaces, that is, both a top surface and a bottom surface, and the connection layer 30 and a connection layer 31 are formed between the wiring layer 11 and the pads 21 formed on both surfaces of each of the substrate 10 and the chip 20.

As described in another embodiment of the present invention, in case that the connection layers 30 and 31 are formed on both surfaces of the substrate 10, the insulation layer forming process, the via hole forming process, and the conductor forming process of the top and bottom surfaces of the substrate 10 can be omitted.

Embodiment of Manufacturing Method of Embedded Printed Circuit Board

Referring to FIGS. 3 to 11, a manufacturing method of the embedded printed circuit board in accordance with the embodiment of the present invention will be described in detail.

FIGS. 3 to 11 are process cross-sectional views sequentially shown for describing the manufacturing method of the embedded printed circuit board in accordance with the embodiment of the present invention.

Figure 3:
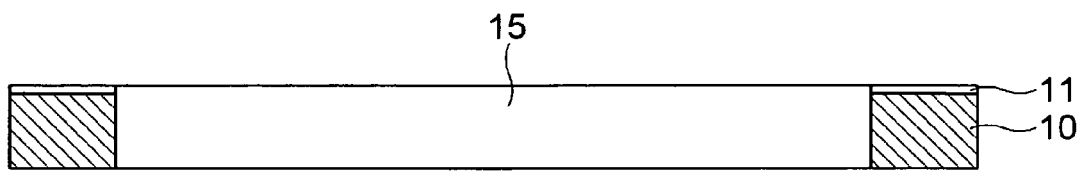
FIGS. 3 to 11 are process cross-sectional views sequentially shown for describing a method of manufacturing an embedded printed circuit board in accordance with an embodiment of the present invention.

As shown in FIG. 3, first, the cavity 15 is formed in a predetermined portion of the substrate 10. The wiring layer 11 is provided on the substrate 10.

The substrate 10 is made of a reinforcement base material such as epoxy, resin, or glass. The wiring layer 11 may be made of copper foil, etc.

The cavity 15 may be formed by various methods such as pressing, drilling, laser processing, and the like. At this time, a desmear process of removing the smear generated at the time of forming the cavity 15 by the pressing or drilling method may be additionally performed.

Figure 4:
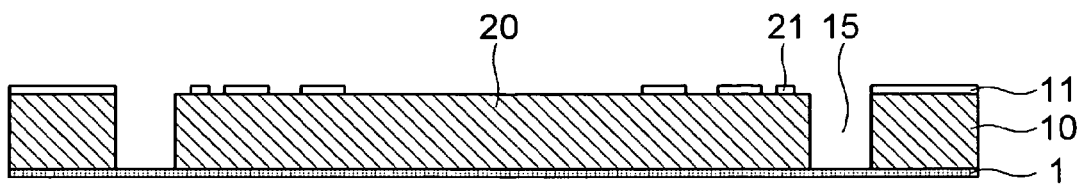

Next, as shown in FIG. 4, an adhesive sheet 1 is attached to the one surface of the substrate 10. Thereafter, the chip 20 having the plurality of pads 21 is inserted into the cavity 15 and is fixed onto the adhesive sheet 1.

The adhesive sheet 1 is used to fix the chip 20 inserted into the cavity 15. A conventional double-sided tape may be used as the adhesive sheet 1.

The chip 20 may be an active element, a passive element, or an IC (Integrated Circuit).

Figure 5:
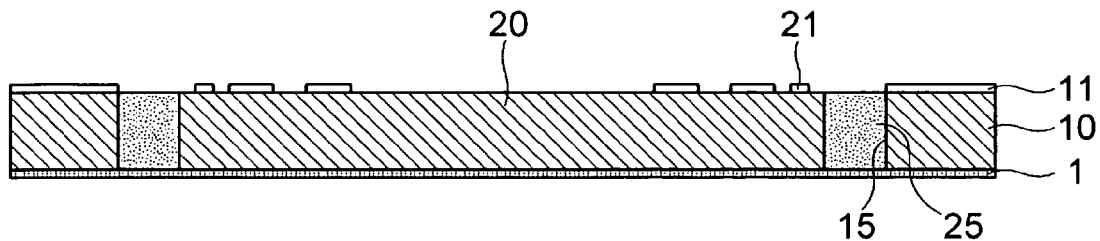

Thereafter, as shown in FIG. 5, the filler 25 is filled between the cavity 15 and the chip 20. The filler 25 may be generally made of resin, epoxy, prepreg, or the like.

Figure 6:
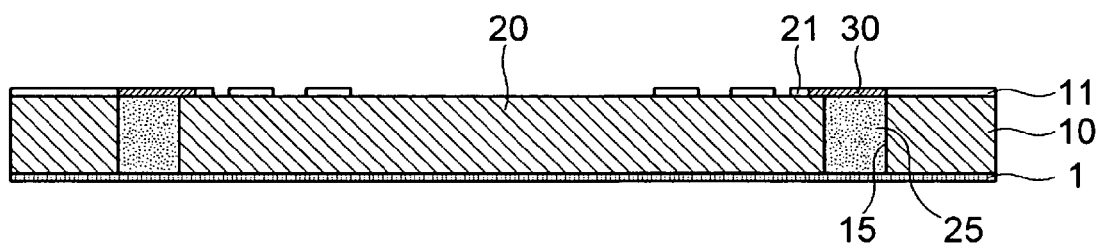

As shown in FIG. 6, the connection layer 30 for connecting the wiring layer 11 and the pad 21 is formed between the wiring layer 11 and the pads 21 of the chip 20. The connection layer 30 may be made of copper (Cu), silver (Ag), or the like. The connection layer 30 may be formed by plating or screen printing.

As shown in the figure, the connection layer 30 is connected to the pads 21 positioned in an outermost portion of the chip 20 to directly connect the outermost pad 21 and the wiring layer 11 to each other. At this time, the connection layer 30 is preferably formed to horizontally connect the wiring layer 11 and the pad 21 to each other on the filler 25.

In the embodiment of the present invention, the outermost pad 21 of the chip 20 is directly fanned out on the same layer by the connection layer 30. Therefore, an insulating layer having the via holes for the fan-out of the outermost pad 21 needs not to be further formed.

Figure 7:
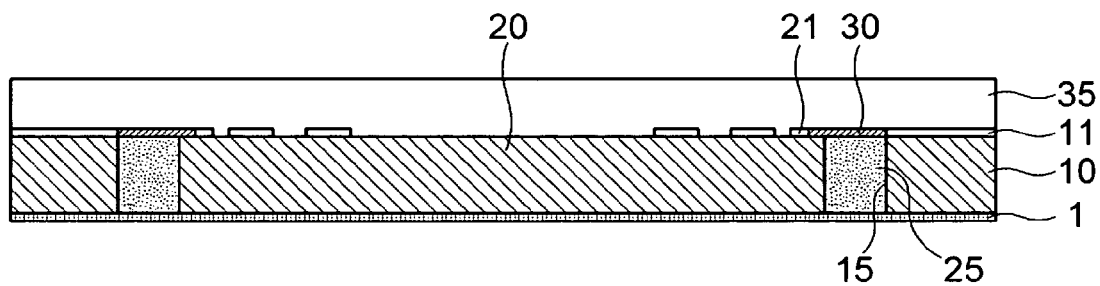

Next, as shown in FIG. 7, a first insulating layer 35 is formed on the connection layer 30.

Figure 8:
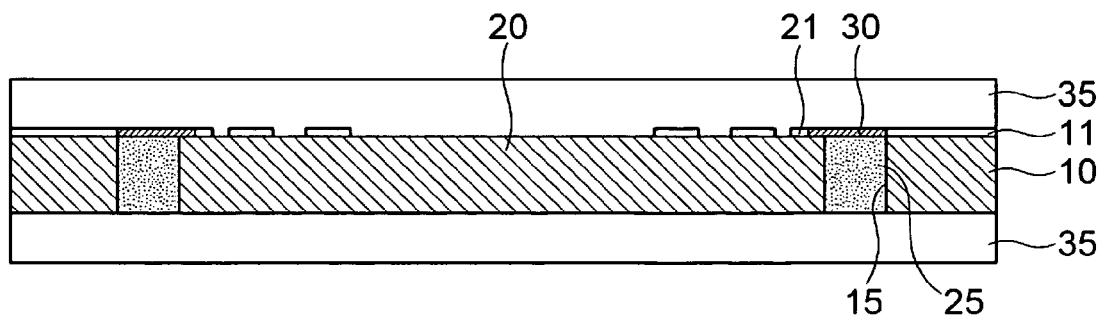

Thereafter, as shown in FIG. 8, the adhesive sheet 1 is removed and the first insulation layer 35 is formed even on the substrate 10 without the adhesive sheet 1.

Figure 9:
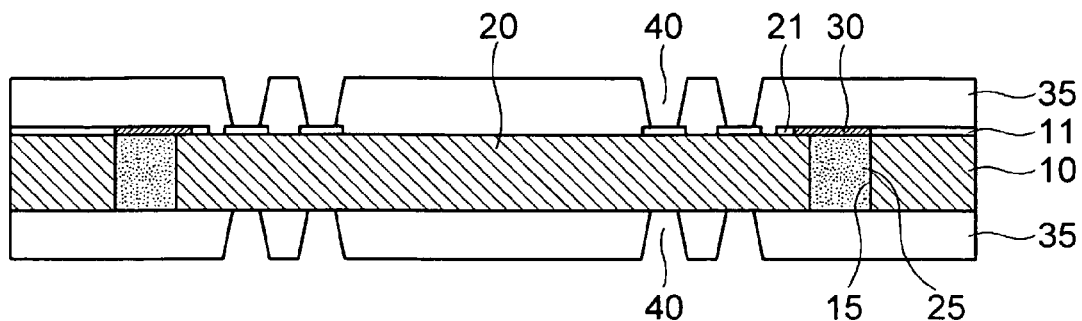

As shown in FIG. 9, a via hole 40 is formed by removing a part of the first insulating layer 35. Herein, the via hole 40 may be formed for the fan-out of the rest of pads 21 other than the outermost pad 21 and the connection of the interlayer wires.

Figure 10:
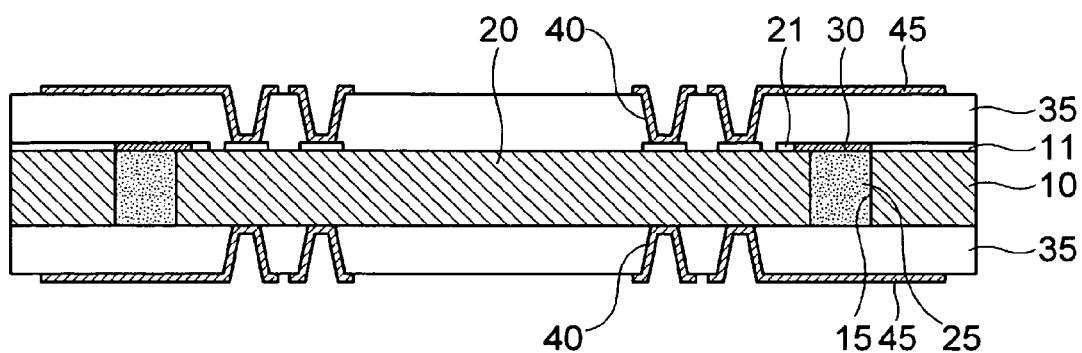

Next, as shown in FIG. 10, a conductive layer 45 is formed on the first insulation layer 35 with the via hole 40.

Figure 11:
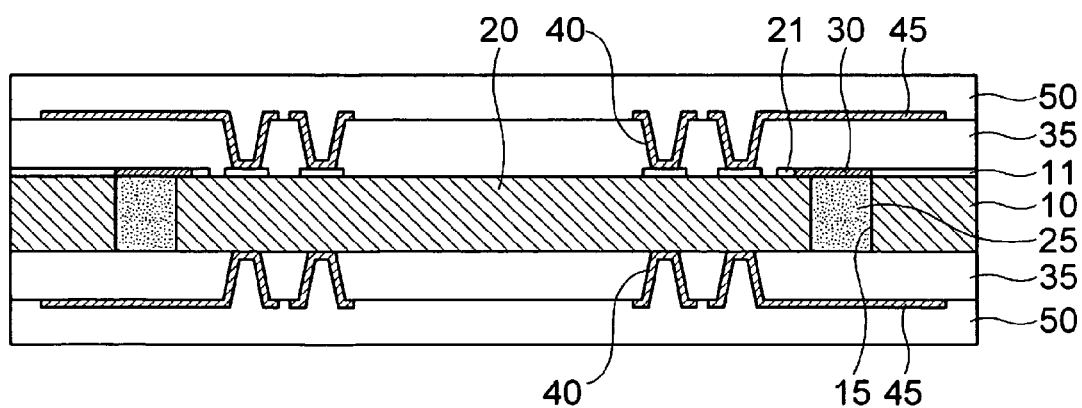

Thereafter, as shown in FIG. 11, a second insulation layer 50 is formed on the first insulation layer 35 with the conductive layer 45. At this time, although not shown in the figure, the via hole and the conductor may be formed on the second insulation layer 50.

Figure 12:
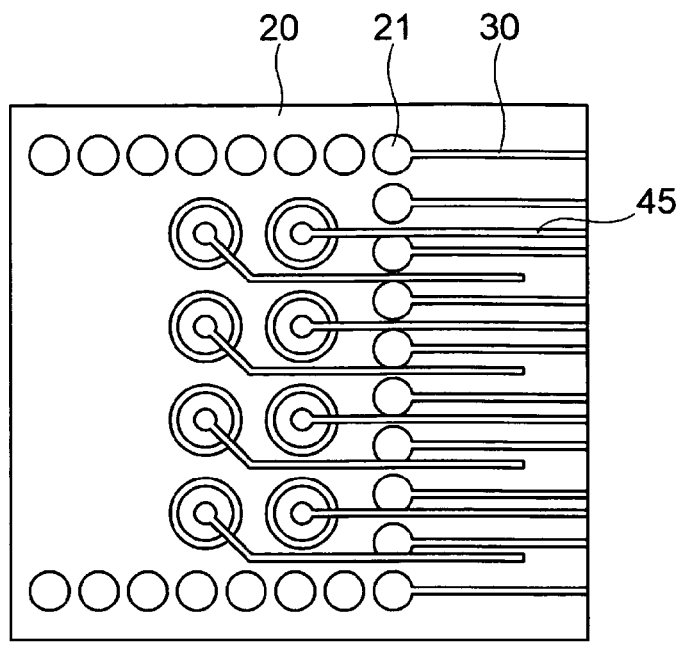
FIG. 12 is a plan view of an embedded printed circuit board in accordance with an embodiment of the present invention.

FIG. 12 is a plan view of the embedded printed circuit board in accordance with the embodiment of the present invention.

In the embodiment of the present invention, as shown in FIG. 12, the outermost pad 21 of the chip 20 may be directly fanned out on the same layer by the connection layer 30 and the rest of pads 21 other than the outermost pad 21 may be fanned out by the conductive layer 45.

Accordingly, by the manufacturing method of the embedded printed circuit board in accordance with the embodiment of the present invention, since the insulation layer forming process, the via hole forming process, and the conductor forming process of one layer for the fan-out of the outermost pad 21 can be omitted, it is possible to thin the board by decreasing the total number of layers on the board and reduce the number of processes and manufacturing cost.

Next, the manufacturing method of the embedded printed circuit board in accordance with another embodiment of the present invention will be descried in detail with reference to FIGS. 13 to 16.

FIGS. 13 to 16 are process cross-sectional views sequentially shown for describing the manufacturing method of the embedded printed circuit board in accordance with another embodiment of the present invention. Hereinafter, a description of contents overlapped with the above-mentioned embodiment, that is, a step of forming the cavity 15 in the substrate 10 (see FIG. 3) to a step of forming the first insulation layer 35 (see FIG. 7) will be omitted.

Figure 13:
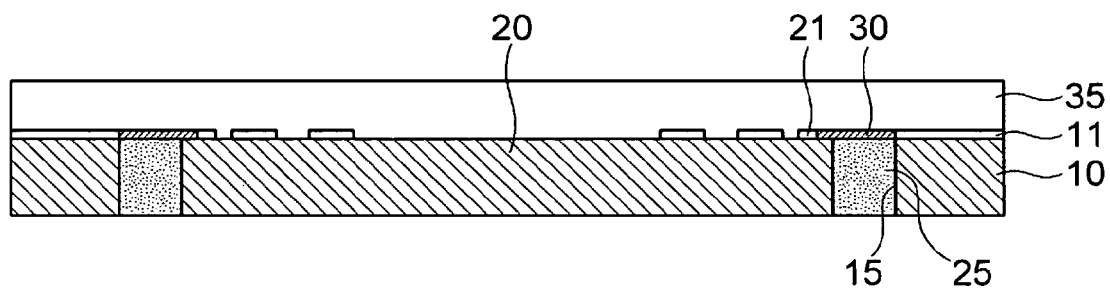
FIGS. 13 to 16 are process cross-sectional views sequentially shown for describing a method of manufacturing an embedded printed circuit board in accordance with another embodiment of the present invention.

After the first insulation layer 35 is formed as shown in FIG. 7, the adhesive sheet 1 formed on the one surface of the substrate 10 is removed as shown in FIG. 13.

Figure 14:
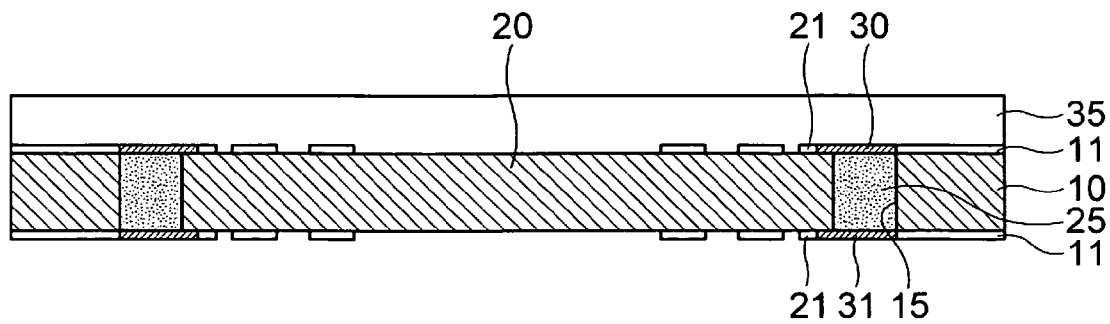

Thereafter, as shown in FIG. 14, the wiring layer 11 and the pads 21 are additionally formed on the substrate 10 exposed by removing the adhesive sheet 1 and the chip 20 and then a second connection layer 31 which is connected to the additionally formed wiring layer 11 and the pads 21 is formed between the additionally formed wiring layer 11 and the pads 21.

The second connection layer 31 may be connected to the pad 21 positioned in the outermost portion of the chip 20. The second connection layer 31 is preferably formed to horizontally connect the additionally formed wiring layer 11 and pads 21 to each other on the filler 25.

The second connection layer 31 may be made of copper (Cu), silver (Ag), or the like.

Figure 15:
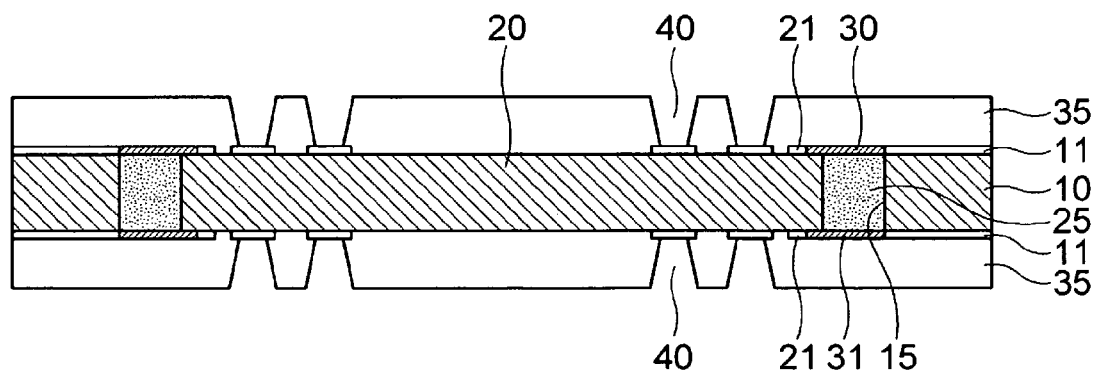
Figure 16:
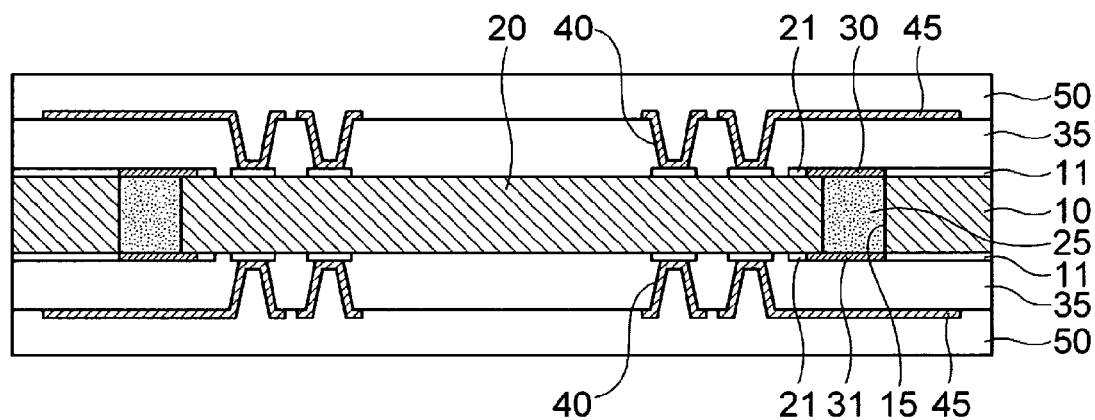

Next, as shown in FIG. 15, after the first insulation layer 35 is formed on the substrate 10 with the second connection layer 31, the via hole 40 is formed by removing a part of the first insulation layer 35.

Thereafter, a conductive layer 45 and a second insulation layer 50 are sequentially formed on the first insulation layer 35 having the via hole 40 formed therein. At this time, although not shown in the figure, the via hole and the conductor may be formed even on the first insulation layer 50.

By the manufacturing method of the embedded printed circuit board in accordance with another embodiment of the present invention, it is possible to omit the insulation layer forming process, the via hole forming process, and the conductor forming process for both the top surface and the bottom surface for the fan-out of the outermost pad 21 formed in a top part and a bottom part of the chip 20 by forming the connection layers 30 and 31 in the top and bottom parts of the substrate 10.

As described above, by the embedded printed circuit board and the manufacturing method thereof in accordance with the present invention, the connection layer connected to the wiring layer and the outermost pad is formed between the wiring layer and the outermost pad and the outermost pad of the chip is directly fanned out on the same layer through the connection layer, whereby the insulation layer forming process, the via hole forming process, and the conductor forming process for the fan-out of the outermost pad may be omitted.

Accordingly, in accordance with the present invention, it is possible to thin the board by decreasing the number of layers of the board and to reduce the number of processes and the manufacturing cost.

The above-mentioned preferred embodiments of the present invention are disclosed for the purpose of exemplification and it will be appreciated by those skilled in the art that changes may be made in these embodiments without departing from the principles and spirit of the general inventive concept, the scope of which is defined in the appended claims and their equivalents.

What is claimed is:

1. A method of manufacturing an embedded printed circuit board, the method comprising:
    forming a cavity in a predetermined portion of a substrate with a wiring layer;
    attaching an adhesive sheet on one surface of the substrate;
    inserting a chip with a plurality of pads into the cavity to fix the inserted chip onto the adhesive sheet;
    filling a filler between the cavity and the chip; and
    forming a connection layer connected to the wiring layer and the pads only in an area between the wiring layer and one or more of the pads, wherein a top surface of the chip and a top surface of the filler are in a same horizontal plane, and wherein the connection layer is formed such that one part of the connection layer is on the top surface of the filler and another part of the connection layer is on the top surface of the chip.

2. The method as recited in claim 1, wherein the connection layer is connected to a pad positioned in an outermost portion of the chip.

3. The method as recited in claim 1, wherein the connection layer is horizontally contacted with one lateral surface of the wiring layer and one lateral surface of a pad selected from the pads, and the one lateral surface of the wiring layer and the one lateral surface of the selected pad are directed perpendicular to the substrate.

4. The method as recited in claim 1, wherein the connection layer is made of copper (Cu) or silver (Ag).

5. The method as recited in claim 1, wherein the chip is any one selected from a group consisting of an active element, a passive element, and an IC (Integrated Circuit).

6. The method as recited in claim 1, wherein the chip is an integrated circuit.

7. The method as recited in claim 1, wherein the connection layer is made by a screen printing method.

* * * * *